United States Patent
Wang et al.

(10) Patent No.: US 8,390,315 B1
(45) Date of Patent: Mar. 5, 2013

(54) CONFIGURABLE INPUT-OUTPUT (I/O) CIRCUITRY WITH PRE-EMPHASIS CIRCUITRY

(75) Inventors: Xiaobao Wang, Cupertino, CA (US);
Chiakang Sung, Milpitas, CA (US);
Joseph Huang, Morgan Hill, CA (US);
Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/354,780

(22) Filed: Jan. 20, 2012

(51) Int. Cl.
*H03K 19/013* (2006.01)
*H03K 17/16* (2006.01)

(52) U.S. Cl. ............... 326/27; 326/26; 326/30; 326/86

(58) Field of Classification Search .................. None
See application file for complete search history.

(56) References Cited

U.S. PATENT DOCUMENTS

| | | | |
|---|---|---|---|
| 7,236,013 B2 * | 6/2007 | Kasanyal et al. | 326/83 |
| 7,265,587 B1 * | 9/2007 | Ng et al. | 326/86 |
| 7,501,851 B2 * | 3/2009 | Venditti et al. | 326/30 |
| 7,538,572 B2 * | 5/2009 | Lee | 326/27 |
| 7,919,984 B2 * | 4/2011 | Balamurugan et al. | 326/82 |

* cited by examiner

*Primary Examiner* — Anh Tran
(74) *Attorney, Agent, or Firm* — David C. Kellogg (57) ABSTRACT

Circuits and techniques for operating an integrated circuit (IC) with a configurable input-output circuit are disclosed. A disclosed circuit includes a single-ended input-output buffer coupled to an output terminal. The single-ended input-output buffer is operable to transmit an input signal to the output terminal as an output signal. A pre-emphasis circuit that is operable to sharpen a first edge and a second edge of the output signal is coupled between the single-ended input-output buffer and the output terminal. The first edge of the output signal is sharpened when the input signal switches from a first logic level to a second logic level while the second edge of the output signal is sharpened when the input signal switches from the second logic level to the first logic level.

12 Claims, 5 Drawing Sheets

PRIOR ART

CONFIGURABLE INPUT-OUTPUT (I/O) CIRCUITRY WITH PRE-EMPHASIS CIRCUITRY

BACKGROUND

Programmable circuits (e.g., field-programmable gate array (FPGA) devices) include logic blocks, generic structures and input-output structures that can be configured to perform any of a variety of functions and support different protocols. For instance, input-output elements on a programmable device may be configurable to support different input-output standards.

Generally, an input-output buffer circuit on a programmable device may support both high-speed single-ended memory standards, such as stub series terminated logic (SSTL), high-speed transceiver logic (HSTL), etc., and differential memory standards, such as low voltage differential signaling (LVDS), etc. For example, a pair of output buffers may be coupled such that they may be configured as either two separate single-ended output buffers or a pair of differential output buffers.

However, in order to fully support different memory interfaces, input-output buffers also need to be able to support high data rate memory transfers. Pin capacitance must be kept substantially low in order to support the ever increasing memory interface performance. For instance, high speed memory devices such as double data rate type 3 (DDR3) and DDR4 devices generally have a relatively low pin capacitance that ranges from 1.5 pF (picofarad) to 2 pF.

The programmable device that is used as a memory controller on the other hand, may generally have a much higher pin capacitance. As a result, the memory controller (i.e., the programmable device) may have an output slew rate that is substantially lower than that of a DDR memory device.

Therefore, even though input-output buffers on a programmable device may be able to support different memory standards, the lower output slew rates may create a potentially performance limiting bottleneck for high data rate memory interfaces.

SUMMARY

An input-output buffer circuit with a pre-emphasis circuit to improve the output slew rate is therefore needed to overcome the bottleneck that can potentially limit the transfer rates of high speed memory interfaces.

Embodiments of the present invention include circuits and techniques to increase the slew rate of an input-output buffer circuit that is operable either as two single-ended input-output buffers or a differential input-output buffer.

It is appreciated that the present invention can be implemented in numerous ways, such as a process, an apparatus, a system, a device, or a method on a computer readable medium. Several inventive embodiments of the present invention are described below.

In one embodiment, a circuit is disclosed. The circuit includes a first single-ended input-output buffer coupled to a first output terminal. The first single-ended input-output buffer is operable to transmit a first input signal to the first output terminal as a first output signal. A first pre-emphasis circuit is coupled between the first single-ended input-output buffer and the first output terminal. The first pre-emphasis circuit is operable to enhance a first edge of the first output signal when the first input signal switches from a first logic level to a second logic level and the first pre-emphasis circuit is further operable to enhance a second edge of the first output signal when the first input signal switches from the second logic level to the first logic level.

In another embodiment, an integrated circuit is disclosed. The integrated circuit includes a phase splitter circuit operable to transmit a pair of differential signals. A first buffer circuit with a first input terminal and a first pre-emphasis circuit is coupled to receive a first signal of the pair of differential signals. The first buffer circuit is operable to transmit a first output signal to a first output terminal. A second buffer circuit with a second input terminal and a second pre-emphasis circuit is coupled to receive a second signal of the pair of differential signals. The second buffer circuit is operable to transmit a second output signal to a second output terminal. The first and second buffer circuits are further operable as one of a first and second single-ended buffer circuits or a pair of differential buffer circuits based on a configuration bit.

In yet another embodiment, a method is disclosed. The method includes receiving a first input signal at a first input terminal. An enable signal is received with a pre-emphasis circuit. The first input signal is transmitted as a first output signal through a first output terminal. At least one edge of the first output signal at the first output terminal is enhanced when the enable signal is at a first logic level and when the first input signal switches between the first logic level and a second logic level.

Other aspects of the exemplary embodiments will become apparent from the following detailed description, taken in conjunction with the accompanying drawings, illustrating by way of example the principles of the embodiments.

Further features of the invention, its nature and various advantages will be more apparent from the accompanying drawings and the following detailed description of the preferred embodiments.

DETAILED DESCRIPTION

An input-output buffer circuit with a pre-emphasis circuit to improve the output slew rate is needed to overcome the bottleneck that can potentially limit the transfer rates of high speed memory interfaces.

It will be obvious, however, to one skilled in the art, that the present exemplary embodiments may be practiced without some or all of these specific details. In other instances, well-known operations have not been described in detail in order not to unnecessarily obscure the present embodiments.

Generally, input-output buffer circuitry may be included on a programmable device to support multiple input-output protocols. For instance, a programmable device may be coupled to an external component through a single-ended input-output interface or the programmable device may be coupled to another external component through a differential input-output interface. The programmable device may thus be configured based on the protocol used. However, different memory interfaces may require different memory speeds. In order to support the ever increasing memory speed of different memory protocols, input-output buffer circuitry on the programmable device may need to have output slew rates that are comparable to the slew rates of the different high-speed memory protocols. It should be appreciated that the slew rate of a device is the rate of change of its output from one state to another (e.g., from high to low or from low to high).

It is therefore desirable for an input-output buffer circuit to have a substantially improved output slew rate in order to fully support different memory interfaces. The embodiments described herein provide techniques and circuits to improve the output slew rate of an input-output buffer circuit that may be operable as two single-ended input-output buffers or a differential input-output buffer. One of the embodiments describes an input-output buffer circuit that includes a pre-emphasis circuit that is operable to increase the output slew rate of the input-output buffer circuit by increasing the output drive strength of the input-output buffer circuit when its output signal is transitioning from one state to another state. With the pre-emphasis circuit providing sufficient drive strength, a separate differential buffer may not be required in the input-output buffer circuit as two single-ended input-output buffers in the input-output buffer circuit may operate as a pair of differential input-output buffers as needed.

Figure 1:
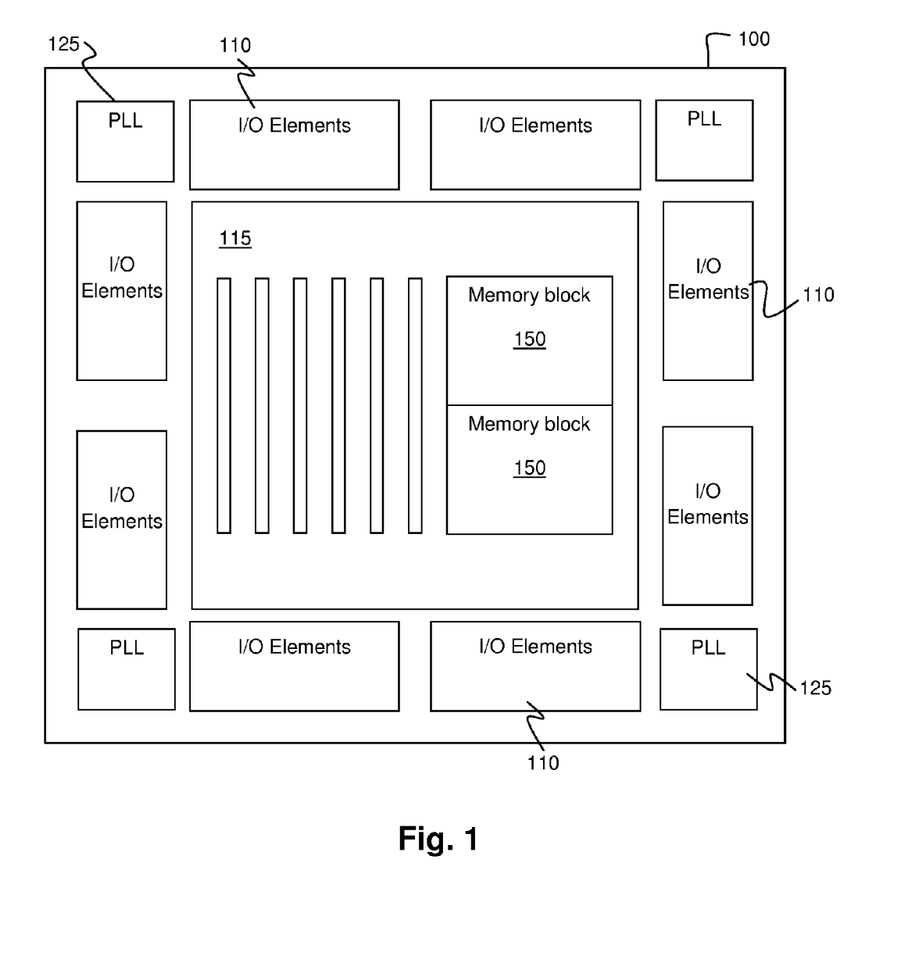
FIG. 1 is a simplified block diagram of an IC in accordance with an embodiment of the present invention.

FIG. 1, meant to be illustrative and not limiting, shows a simplified block diagram of IC 100 that can implement embodiments of the present invention. IC 100 includes core logic region 115 and input-output (I/O) elements 110. Other auxiliary circuits such as phase-locked loops (PLLs) 125 for clock generation and timing, can be located outside the core logic region 115 (e.g., at corners of IC 100 and adjacent to I/O elements 110).

Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to product control signals that configure the LEs and groups of LEs and LABs to perform the desired logical functions. Core logic region 115 may also include a plurality of embedded memory blocks 150 that can be used to perform a variety of functions.

Referring still to FIG. 1, I/O elements 110 may support a variety of interface protocols. I/O elements 110 may support a variety of single-ended and differential I/O standards. I/O elements 110 may also include I/O buffers that connect IC 100 to other external components. Signals from core region 115 are transmitted through I/O elements 110 to external components that may be connected to IC 100. A single device like IC 100 can potentially support a variety of different interfaces and each individual I/O bank 110 can support a different I/O standard with a different interface or a different voltage level. IC 100 receives signals from external circuitry at I/O elements 110. Core logic region 115 and other logic blocks on IC 100 may perform functions based on the signals received. Signals may be sent from core logic region 115 and other relevant logic blocks of IC 100 to other external circuitry or components that may be connected to IC 100 through I/O elements 110.

Figure 2:
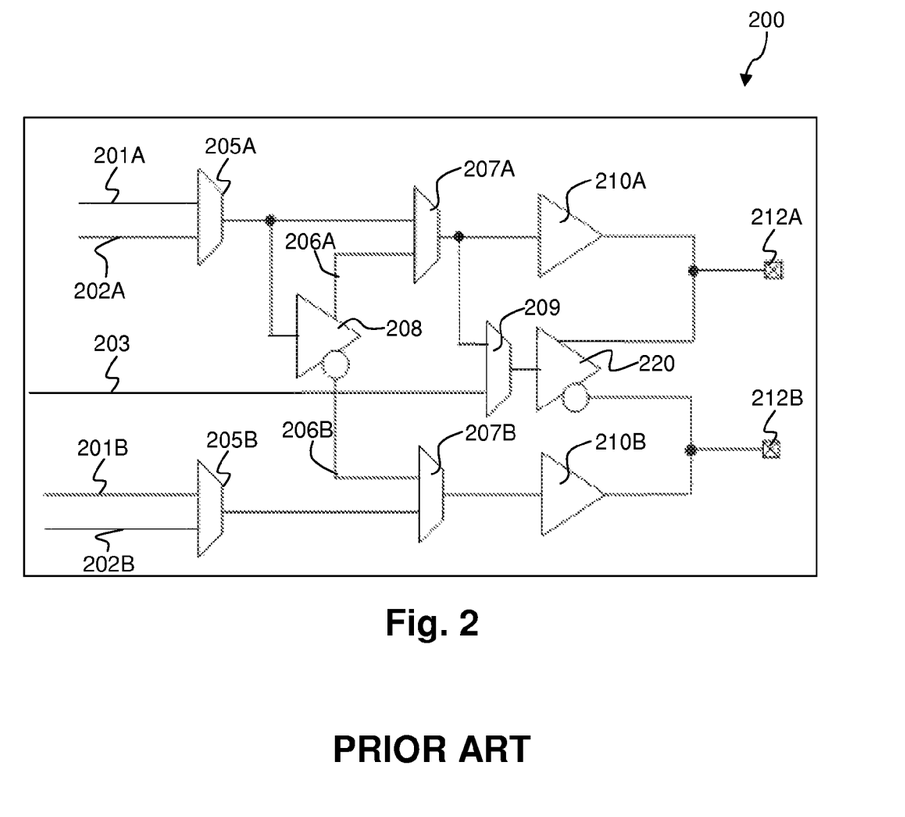
FIG. 2 is a simplified block diagram of a conventional input-output buffer circuit with two single-ended input-output buffers and a differential input-output buffer.

FIG. 2, meant to be illustrative and not limiting, shows a block diagram of a conventional input-output buffer circuit 200 with two single-ended input-output buffers, 210A and 212B, and a differential input-output buffer 220. Input-output buffer circuit 200 includes selector circuits 205A and 205B that may receive signals from different circuitry or logic blocks from the IC. For instance, each of selector circuits 205A and 205B may receive signals from input-output decoders at input terminals 201A and 201B. Selector circuits 205A and 205B may further receive signals from other components on the IC (e.g., phase-locked loop (PLL) circuitry, etc.) at input terminals 202A and 202B.

Phase splitter circuit 208 is coupled to an output of selector circuit 205A. It should be appreciated that phase splitter circuit 208 may split the output signal from selector circuit 205A into two different outputs 206A and 206B. Outputs 206A and 206B from phase splitter circuit 208 may be two complementary outputs or may be two similar outputs with opposite phases. Outputs 206A and 206B are coupled to selector circuits 207A and 207B, respectively. Each of selector circuits 207A and 207B selects either an output from phase splitter circuit 208 or an output from each of selector circuits 205A and 205B respectively. The output from selector circuit 207B is coupled to single-ended input-output buffer 210B and the output of input-output buffer 210B is further coupled to input-output port 212B on the IC.

The output of selector circuit 207A, on the other hand, is coupled to yet another selector circuit (i.e., selector circuit 209) and single-ended input-output buffer 210A. Selector circuit 209 receives two input signals, namely, the output from selector circuit 207A and input signals 203 from a differential interface (e.g., low-voltage differential signaling (LVDS) interface). The output of selector circuit 209 is coupled to differential input-output buffer circuit 220. Differential input-output buffer circuit 220 produces a pair of differential outputs coupled to input-output ports 212A and 212B.

It should be appreciated that when input-output buffer circuit 200 is coupled to an external component through a differential input-output protocol, input-output ports 212A and 212B may operate as a pair of differential input-output ports, and when input-output buffer circuit 200 is coupled to an external component through a single-ended input-output protocol, input-output ports 212A and 212B may operate as individual single-ended input-output ports.

Even though input-output buffer circuit 200 may support different input-output protocols (i.e., single-ended and differential signals) a dedicated differential input-output buffer 220 is generally needed. This is because, for differential outputs (e.g., LVDS outputs) the specified drive strength may be relatively low. Therefore, the circuit may not be able to have high output slew rates with the relatively low drive strength. A dedicated differential input-output buffer (e.g., differential input-output buffer 220) is generally needed in order for input-output buffer circuit 200 to support high-speed differential interfaces.

Figure 3:
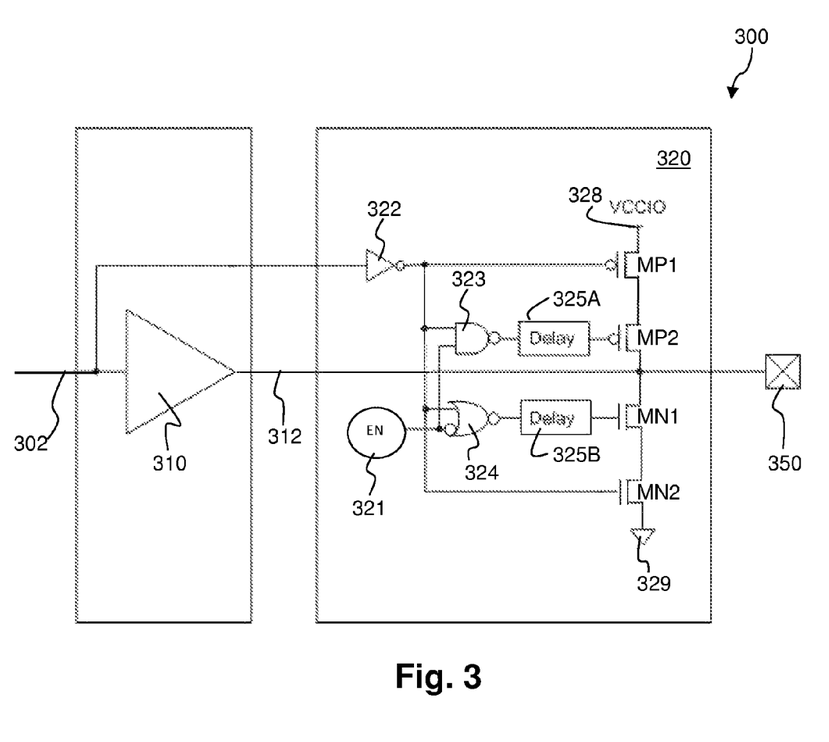
FIG. 3 is a schematic diagram of an input-output buffer circuit with a pre-emphasis circuit in accordance with an embodiment of the present invention.

FIG. 3, meant to be illustrative and not limiting, shows an input-output buffer circuit 300 with pre-emphasis circuit 320 as one embodiment in accordance with the present invention. In the embodiment of FIG. 3, pre-emphasis circuit 320 may include four transistors, MP1, MP2, MN1 and MN2, two delay circuits 325A and 325B and logic gates 323 and 324. Pre-emphasis circuit 320 is coupled in parallel to single-ended driver circuit 310. Single-ended driver circuit 310 may be calibrated to a specified value (e.g. 34 ohm or 40 ohm) based on the memory interface used, according to one embodiment.

In the embodiment of FIG. 3, transistors MP1 and MP2 may be p-channel transistors while transistors MN1 and MN2 may be N-channel transistors. Transistors MP1, MP2, MN1 and MN2 are coupled in series with a first source-drain terminal of transistor MP1 coupled to voltage level 328 and a first source-drain terminal of transistor MN2 coupled to voltage level 329. In one embodiment, voltage level 328 may be a positive voltage level (e.g., VCCIO) while voltage level 329 may be a ground voltage (e.g., GND).

Input-output buffer circuit 300 is operable to receive an input signal at input terminal 302. In an exemplary embodiment, input-output buffer circuit 300 may be an input-output buffer circuit on an IC and the input signal may be a signal from other components or logic blocks on the IC. An input of the pre-emphasis circuit 320 is coupled to receive the input signal at input terminal 302.

The gates of transistors MP1 and MN2 are coupled to receive an inverted version of the input signal through inverter circuit 322. Logic gates 323 and 324 are coupled to receive the inverted input signal from inverter circuit 322 at a first input terminal. A second input terminal of each of logic gates 323 and 324 is coupled to receive an enable signal, EN 321. According to one embodiment, the enable signal, EN 321, may be a signal generated by other components on an IC. According to another embodiment, the enable signal, EN 321, may be a configuration bit on the IC.

The gates of transistors MP2 and MN1 are coupled to receive a delayed version of the outputs from logic gates 323 and 324 through delay circuits 325A and 325B, respectively. In one embodiment, when enable signal, EN 321 is at a logic low level, pre-emphasis circuit 320 may be tri-stated. It should be appreciated that a tri-state circuit may have three outputs, namely, high, low and float. In one embodiment, pre-emphasis circuit 320 is in a high impedance state when pre-emphasis circuit 320 is tri-stated.

In an exemplary embodiment, pre-emphasis circuit 320 may drive the input signal when pre-emphasis circuit 320 is enabled (i.e., when enable signal EN 321 is at a logic high level). When enable signal EN 321 is at a logic high level and when the input signal at input terminal 302 switches from a logic low level to a logic high level (e.g., from 0 to 1) transistors MP1 and MP2 are turned on and transistors MN1 and MN2 are turned off. Therefore, according to one embodiment, pre-emphasis may provide additional drive strength to input-output buffer driver circuit 310 to increase a rising edge slew rate of an output signal at output port 350 when the input signal is transitioning from a logic low level to a logic high level.

After a period of delay, based on the delay from delay circuit 325A, transistor MP2 is turned off and transistor MN1 is turned on and pre-emphasis circuit 320 may be tri-stated. In one embodiment, delay circuits 325A and 325B may include a plurality of buffer circuits coupled to each other where each of the buffer circuits may be turned on or off based to generate a specific amount of delay.

In another embodiment, when enable signal EN 321 is at a logic high level and when the input signal at input terminal 302 switches from a logic high level to a logic low level (e.g., from 1 to 0) transistors MP1 and MP2 are turned off and transistors MN1 and MN2 are turned on. Therefore, according to one embodiment, pre-emphasis circuit 320 may provide additional drive strength to input-output buffer driver circuit 310 to increase a falling edge slew rate of an output signal at output port 350 when the input signal is transitioning from a logic high level to a logic low level.

After a period of delay based on the delay generated by delay circuit 325B, transistor MN1 is turned off and transistor MP2 is turned on and pre-emphasis circuit may be tri-stated. It should be appreciated that the amount of delay and the drive strength of pre-emphasis circuit 320 may be optimized for specific applications as required or may be configured for desired performance.

Figure 4:
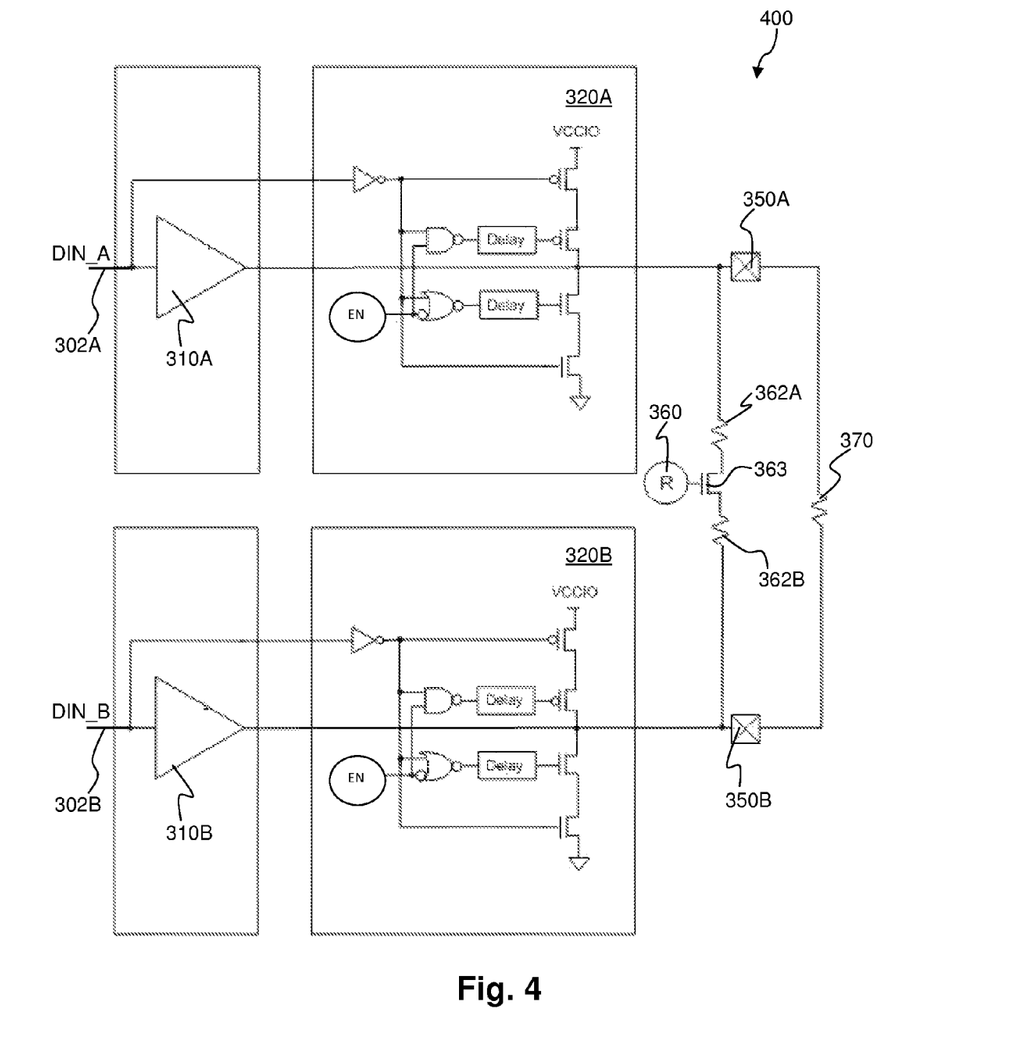
FIG. 4 is a schematic diagram of two input-output driver circuits coupled together to form a differential buffer circuit with pre-emphasis circuits in accordance with an embodiment of the present invention.

FIG. 4, meant to be illustrative and not limiting, shows input-output driver circuits 310A and 310B coupled together to form a differential buffer circuit 400 with pre-emphasis circuits 320A and 320B as one embodiment in accordance with the present invention. It should be appreciated that FIG. 4 shares similarities with input-output buffer circuit 300 and therefore, for the sake of brevity, elements that have been described above will not be described in detail. In one embodiment, input-output driver circuits 310A and 310B may be single-ended input-output driver circuits that are operable to support single-ended input-output interfaces such as Stub Series Terminated Logic (SSTL), High-Speed Transceiver Logic (HSTL), etc.

The embodiment of FIG. 4 shows differential input-output buffer circuit 400 with differential outputs 350A and 350B formed by two single-ended input-output driver circuits 310A and 310B. Differential input-output buffer circuit 400 may receive input signals DIN_A and DIN_B at input terminals 302A and 302B respectively. In an exemplary embodiment, input signals DIN_A and DIN_B may be two complementary signals from a signal splitter circuit.

External termination resistor 370 is coupled between output ports 350A and 350B and termination resistors 362A and 362B are coupled between pre-emphasis circuits 320A and 320B and output ports 350A and 350B. In one embodiment, termination resistors 362A and 362B may be coupled to a configuration bit 360 through transistor 363. In an exemplary embodiment, differential buffer circuit 400 may be a differential input-output buffer circuit on a programmable circuit, and configuration bit 360 may be a random access memory (RAM) bit on the programmable circuit that may be used to turn termination resistors 362A and 362B on through transistor 363 when input-output buffer circuit 400 is operating as a differential input-output buffer circuit and may be used to turn termination resistors 362A and 362B off when input-output buffer circuit 400 is operating as two single-ended input-output buffer circuits.

It should be appreciated that the size of resistors 362A and 362B may be selected based on the differential output voltage (VOD) of the input-output differential buffer circuit 400. In an exemplary embodiment, input-output driver circuits 310A and 310B may be configured with different drive strengths and termination resistors 362A and 362B may be configured based on the drive strength of input-output driver circuits 310A and 310B.

For instance, the drive strength of input-output driver circuits 310A and 310B may be configured to 150 ohm and the drive strength of pre-emphasis circuits 320A and 320B is configured to 50 ohm. External termination resistor 370 may be configured to 100 ohm and differential termination resistors 362A and 362B may be set to 200 ohm to achieve an effective differential output impedance of 120 ohm. In one embodiment, without the differential output termination from termination resistors 362A and 362B, the effective differential output impedance may be substantially higher.

Pre-emphasis circuits 320A and 320B, coupled to input-output driver circuit 310A and output ports 350A and input-output driver circuit 310B and output ports 350B, respectively, may be operable to add emphasis to at least one edge of the output signals at output ports 350A and 350B. In an exemplary embodiment, when input signal DIN_A at input terminal 302A switches between a first logic level and a second logic level, pre-emphasis circuit 320A may be operable to add pre-emphasis to an edge (e.g., a rising edge or a falling edge) of an output signal at output port 350A. When input signal DIN_B at input terminal 302B switches between the first logic level to the second logic level, pre-emphasis circuit 320B may be operable to add pre-emphasis to an edge (e.g., a rising edge or a falling edge) of an output signal at output port 350B.

Figure 5:
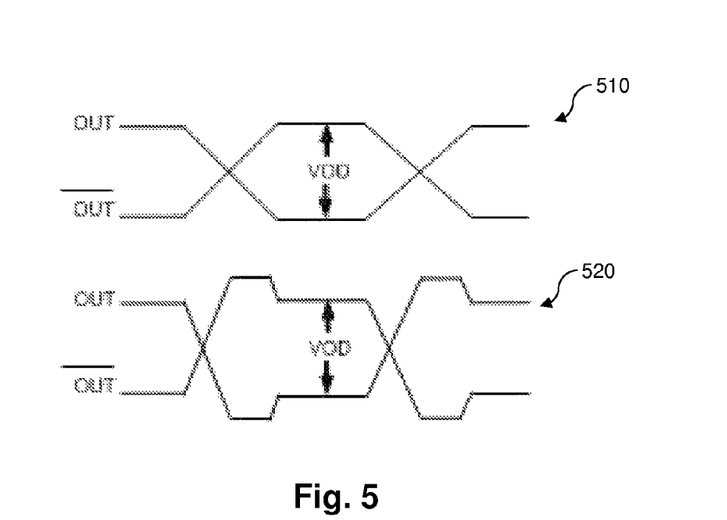
FIG. 5 is a signal transition over time with exemplary waveforms representing output signals without and with a pre-emphasis circuit respectively in accordance with an embodiment of the present invention.

FIG. 5, meant to be illustrative and not limiting, shows exemplary output waveforms 510 and 520 representing output signals without and with a pre-emphasis circuit respectively. In one embodiment, waveform 510 represents output signals from an input-output buffer circuit without a pre-emphasis circuit similar to input-output buffer circuit 200 of FIG. 2 and waveform 520 represents output signals from a differential input-output buffer circuit with a pre-emphasis circuit similar to differential input-output buffer circuit 400 of FIG. 4. It should be appreciated that waveforms 510 and 520 illustrate at least a single complete cycle of an output signal with a rising edge and a falling edge.

In the embodiment of FIG. 5, compared to the output of waveform 520, the slew rate of the output of waveform 510 does not exceed the differential output voltage (VOD) of the differential signal. The output signal with a pre-emphasis as represented by waveform 520 may have an increased slew rate when the output signal switches between two different states. In the embodiment of FIG. 5, the output signal with a pre-emphasis circuit is boosted or enhanced when the output signal switches from one state to another compared to the output signal from a circuit without a pre-emphasis circuit.

In other words, the output signal, as shown by waveform 520, switches to a relatively higher voltage when it switches from a logic high level to a logic low level and vice versa, compared to the output signal from a circuit without a pre-emphasis circuit, as shown by waveform 510. In one embodiment, the rising edge of waveform 520 shows a transition of a signal between two logic states in differential input-output buffer circuit 400 of FIG. 4.

Figure 6:
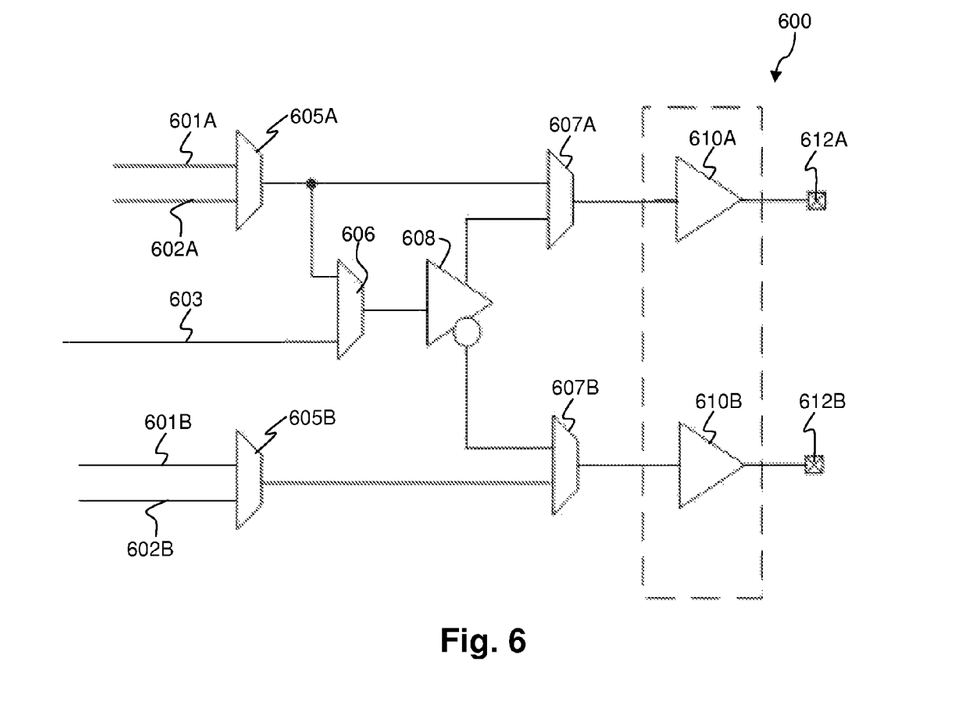
FIG. 6 is a simplified block diagram of an input-output circuit with pre-emphasis in accordance with an embodiment of the present invention.

FIG. 6, meant to be illustrative and not limiting, shows an input-output circuit 600 with pre-emphasis as one embodiment in accordance with the present invention. Input-output circuit 600 may be an input-output buffer circuit with pre-emphasis on an IC device (e.g., IC 100 of FIG. 1). Input-output buffer circuit 600 includes selector circuits 605A and 605B that may receive signals from different circuitry or logic blocks from the IC. For instance, selector circuits 605A and 605B may receive signals from input-output decoders at input terminals 601A and 601B. Selector circuits 605A and 605B may further receive signals from other components on the IC (e.g., phase-locked loop (PLL) circuitry, etc.) at input terminals 602A and 602B.

According to the embodiment of FIG. 6, another selector circuit, 606, may be coupled to an output of selector circuit 605A. Selector circuit may also be coupled to receive signals from a differential interface (e.g., a low voltage differential signaling (LVDS) interface, low voltage positive emitter-coupled logic (LVEPCL) interface, etc.) at input terminal 603 and may select either the output of selector circuit 605A or the signal from the differential interface received at input terminal 603 as an output.

The output of selector circuit 606 may be coupled to phase splitter circuit 608. It should be appreciated that phase splitter circuit 608 may split the output signal from selector circuit 605A into two different outputs. In an exemplary embodiment, the two different outputs may be a pair of differential signals with complementary values. In the embodiment of FIG. 6, the outputs from phase splitter circuit 608 are coupled to selector circuits 607A and 607B, respectively. Each of selector circuits 607A and 607B selects either an output from phase splitter circuit 608 or an output from each of selector circuits 605A and 605B, respectively, as an output.

The output from selector circuit 607A is coupled to single-ended input-output buffer circuit 610A while the output from selector circuit 607B is coupled to single-ended input-output buffer circuit 610B. An output from each of single-ended input-output buffer circuits 610A and 610B is coupled respectively to input-output ports 612A and 612B on the IC. In one embodiment, each of single-ended input-output buffer circuits 610A and 610B may be an input-output buffer circuit that includes a pre-emphasis circuit similar to pre-emphasis circuit 320 in input-output buffer circuit 300 of FIG. 3.

In an exemplary embodiment, input-output ports 612A and 612B may operate separately as two single-ended input-output ports or a pair of differential input-output ports. For instance, input-output circuit 600 may be configured to support a single-ended memory interface (e.g., SSTL, HSTL, etc.) or a differential memory interface (e.g., LVDS, LVEPCL, etc.). A configuration bit may be used to configure input-output circuit 600 either as a single-ended buffer circuit or a differential buffer circuit, according to one embodiment. Therefore, compared to input-output buffer circuit 200 of FIG. 2, a dedicated differential input-output buffer (e.g., differential input-output buffer 220) may not be needed in input-output circuit 600.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A circuit comprising:
    a first single-ended input-output buffer coupled to a first output terminal, wherein the first single-ended input-output buffer is operable to transmit a first input signal to the first output terminal as a first output signal; and
    a first pre-emphasis circuit coupled between the first single-ended input-output buffer and the first output terminal, wherein the first pre-emphasis circuit is operable to enhance a first edge of the first output signal when the first input signal switches from a first logic level to a second logic level, wherein the first pre-emphasis circuit is further operable to enhance a second edge of the first output signal when the first input signal switches from the second logic level to the first logic level, and wherein the first pre-emphasis circuit comprises:
        a plurality of transistors coupled in series and coupled to receive the first input signal, wherein the plurality of transistors is coupled to the first output terminal;
        at least one delay circuit coupled to a gate of at least one transistor of the plurality of transistors;
        an inverter circuit coupled to receive the first input signal and coupled to the plurality of transistors; and
        at least one logic gate coupled to the at least one delay circuit and the inverter circuit, wherein the at least one logic gate is coupled to receive an enable signal and an inverted version of the first input signal, wherein the enable signal is operable to place the first pre-emphasis circuit in a high-impedance state when the enable signal is at the second logic level, and wherein the plurality of transistors comprises:
            a first transistor having a first source-drain terminal coupled to a first voltage level and having a gate coupled to receive the inverted version of the first input signal; and
            a second transistor having a first source-drain terminal coupled to the first transistor, having a gate coupled to the at least one delay circuit, and having a second source-drain terminal coupled to the first output terminal.

2. The circuit of 1, wherein the second logic level is a logic low level and wherein the circuit is tri-stated when the enable signal is at the logic low level.

3. The circuit of claim 1, further comprising:
    a third transistor having a first source-drain terminal coupled to a second source-drain terminal of the second transistor;
    at least one other delay circuit coupled to a gate of the third transistor;
    at least one other logic gate coupled to the at least one other delay circuit, wherein the at least one other logic gate is operable to receive an inverted version of the enable signal and the inverted version of the first input signal; and
    a fourth transistor coupled to a second source-drain terminal of the third transistor, wherein the fourth transistor comprises a gate coupled to receive the inverted version of the first input signal and a second source-drain terminal coupled to a second voltage level.

4. The circuit of claim 3, wherein the first and second transistors include p-channel transistors and wherein the third and fourth transistors include n-channel transistors.

5. The circuit of claim 3, wherein the first and second transistors are turned on and the third and fourth transistors are turned off as the first input signal transitions from the first logic level to the second logic level, wherein the second transistor is turned off after a first amount of delay determined by the at least one delay circuit after the first input signal transitions from the first logic level to the second logic level, wherein the third and fourth transistors are turned on and the first and second transistors are turned off as the first input signal transitions from the second logic level to the first logic level, and wherein the third transistor is turned off after a second amount of delay determined by the at least one other delay circuit after the first input signal transitions from the second logic level to the first logic level.

6. A circuit comprising:
    a first single-ended input-output buffer coupled to a first output terminal, wherein the first single-ended input-output buffer is operable to transmit a first input signal to the first output terminal as a first output signal;
    a first pre-emphasis circuit coupled between the first single-ended input-output buffer and the first output terminal, wherein the first pre-emphasis circuit is operable to enhance a first edge of the first output signal when the first input signal switches from a first logic level to a second logic level, and wherein the first pre-emphasis circuit is further operable to enhance a second edge of the first output signal when the first input signal switches from the second logic level to the first logic level;
    a second single-ended input-output buffer coupled to a second output terminal, wherein the second single-ended input-output buffer is operable to transmit a second input signal to the second output terminal as a second output signal;
    a second pre-emphasis circuit coupled between the second single-ended input-output buffer and the second output terminal, wherein the second pre-emphasis circuit is operable to enhance at least one edge of the second output signal at the second output terminal when the second input signal switches between the first logic level and the second logic level; and
    a termination resistor coupled between the first and second output terminals and the first and second pre-emphasis circuits, wherein the termination resistor is operable to be turned on or off based on a configuration bit, wherein the first and second output terminals are a pair of differential output terminals when the termination resistor is turned on, and wherein the first and second output terminals operate as two individual single-ended output terminals when the termination resistor is turned off.

7. The circuit of claim 6, wherein the circuit is an input-output circuit on a programmable logic device, and wherein the configuration bit is a configuration random access memory (CRAM) bit on the programmable logic device.

8. The circuit of claim 7, wherein the input-output circuit is coupled to a phase splitter circuit on the programmable logic device, and wherein the first and second input signals are differential signals from the phase splitter circuit.

9. An integrated circuit comprising:
a phase splitter circuit operable to transmit a pair of differential signals;
a first buffer circuit having a first input terminal and a first pre-emphasis circuit coupled to receive a first signal of the pair of differential signals, wherein the first buffer circuit is operable to transmit a first output signal to a first output terminal;
a second buffer circuit having a second input terminal and a second pre-emphasis circuit coupled to receive a second signal of the pair of differential signals, wherein the second buffer circuit is operable to transmit a second output signal to a second output terminal, and wherein the first and second buffer circuits are operable as one of first and second single-ended buffer circuits or a pair of differential buffer circuits based on a configuration bit; and
a first resistor coupled between the first and second output terminals, wherein the first resistor is operable to be turned on and off based on the configuration bit, wherein the first resistor is turned on when the first and second buffer circuits are operating as a pair of differential buffer circuit.

10. An integrated circuit comprising:
a phase splitter circuit operable to transmit a pair of differential signals;
a first buffer circuit having a first input terminal and a first pre-emphasis circuit coupled to receive a first signal of the pair of differential signals, wherein the first buffer circuit is operable to transmit a first output signal to a first output terminal; and
a second buffer circuit having a second input terminal and a second pre-emphasis circuit coupled to receive a second signal of the pair of differential signals, wherein the second buffer circuit is operable to transmit a second output signal to a second output terminal, wherein the first and second buffer circuits are operable as one of first and second single-ended buffer circuits or a pair of differential buffer circuits based on a configuration bit, wherein each of the first and second pre-emphasis circuits is coupled to receive a control signal operable to place the first and second pre-emphasis circuits in a high-impedance state, and wherein each of the first and second pre-emphasis circuits comprises:
a first transistor having a first source-drain terminal coupled to a first voltage level and a gate coupled to receive an inverted version of one of the first input signal or the second input signal;
a second transistor having a first source-drain terminal coupled to the first transistor, a gate coupled to a first delay circuit and a second source-drain terminal coupled to one of the first output terminal or the second output terminal;
a third transistor having a first source-drain terminal coupled to a second source-drain terminal of the second transistor and a gate coupled to a second delay circuit, wherein the second and third transistors are operable to be disabled based on the control signal; and
a fourth transistor coupled to the third transistor, a gate coupled to receive the inverted version of the input signal and a second source-drain terminal coupled to a second voltage level.

11. The integrated circuit of claim 10, wherein each of the delay circuits comprises a plurality of inverter circuits coupled in series.

12. The integrated circuit of claim 10, wherein the first pre-emphasis circuit is operable to raise the first output signal at the first output terminal when the first input signal switches from a first logic level to a second logic level, wherein the second pre-emphasis circuit is operable to lower the second output signal at the second output terminal when the second input switches from the second logic level to the first logic level, wherein the first logic level is a logic low level, and wherein the second logic level is a logic high level.

* * * * *